United States Patent
Rofougaran et al.

(10) Patent No.: US 8,514,997 B2
(45) Date of Patent: Aug. 20, 2013

(54) METHOD AND SYSTEM FOR A RECEIVER WITH UNDERSAMPLING MIXING USING MULTIPLE CLOCK PHASES

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 1013 days.

(21) Appl. No.: 11/864,743

(22) Filed: Sep. 28, 2007

(65) Prior Publication Data
US 2009/0086850 A1    Apr. 2, 2009

(51) Int. Cl.
*H04L 7/043* (2006.01)

(52) U.S. Cl.
USPC .............................. 375/373; 375/362; 375/354

(58) Field of Classification Search
USPC .......................................................... 375/373
See application file for complete search history.

(56) References Cited

U.S. PATENT DOCUMENTS

| | | | | |
|---|---|---|---|---|
| 4,064,538 A * | 12/1977 | Broussaud | | 386/206 |
| 4,768,109 A * | 8/1988 | Matsuo | | 386/307 |
| 5,636,251 A * | 6/1997 | Citta et al. | | 375/341 |
| 6,608,480 B1 * | 8/2003 | Weyers | | 324/318 |
| 7,382,825 B1 * | 6/2008 | Sonntag | | 375/224 |
| 7,386,080 B2 * | 6/2008 | Paillet et al. | | 375/355 |
| 7,443,941 B2 * | 10/2008 | Farjad-rad | | 375/373 |
| 7,711,066 B2 * | 5/2010 | Jiang et al. | | 375/296 |
| 7,734,271 B2 * | 6/2010 | Pepper et al. | | 455/313 |
| 7,839,313 B2 * | 11/2010 | Kidambi | | 341/118 |
| 7,844,023 B2 * | 11/2010 | Farjad-Rad | | 375/373 |
| 8,107,515 B2 * | 1/2012 | Cannon et al. | | 375/222 |
| 2002/0018520 A1 * | 2/2002 | Eidson | | 375/150 |
| 2003/0020644 A1 * | 1/2003 | Yeap et al. | | 341/144 |
| 2003/0118107 A1 * | 6/2003 | Itakura et al. | | 375/240.19 |
| 2004/0008805 A1 * | 1/2004 | Xiu et al. | | 375/376 |
| 2004/0150453 A1 * | 8/2004 | Farjad-rad | | 327/307 |
| 2005/0195894 A1 * | 9/2005 | Kim et al. | | 375/232 |
| 2006/0294442 A1 * | 12/2006 | Kanter et al. | | 714/733 |
| 2007/0140382 A1 * | 6/2007 | Qian | | 375/332 |
| 2008/0020726 A1 * | 1/2008 | Blackham et al. | | 455/249.1 |
| 2008/0025437 A1 * | 1/2008 | Huynh | | 375/324 |
| 2008/0208529 A1 * | 8/2008 | Sonntag | | 702/180 |
| 2009/0033529 A1 * | 2/2009 | Raz et al. | | 341/120 |

* cited by examiner

*Primary Examiner* — Chieh M Fan
*Assistant Examiner* — Santiago Garcia
(74) *Attorney, Agent, or Firm* — Farjami & Farjami LLP

(57) ABSTRACT

Methods and systems for a receiver with undersampling mixing using multiple clock phases are disclosed and may include undersampling a received wireless signal utilizing multiple undersamplers and clocking each of the undersamplers with a separate clock signal. Each of the clock signals may be at a sampling frequency but with a different phase angle. The difference of the phase angle between each of the clock signals may be adjusted and may be determined by the number of undersamplers. A gain ratio may be configured for two signals summed to generate each of the clock signals for the phase angle adjusting. The two signals may include in-phase and quadrature signals. Each of the summed signals may be normalized utilizing limiters. The sampling frequency may be an integer sub-harmonic of the received signal. The undersamplers may include track and hold or sample and hold circuits.

15 Claims, 4 Drawing Sheets

METHOD AND SYSTEM FOR A RECEIVER WITH UNDERSAMPLING MIXING USING MULTIPLE CLOCK PHASES

CROSS-REFERENCE TO RELATED APPLICATIONS/INCORPORATION BY REFERENCE

[Not Applicable]

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for a receiver with undersampling mixing using multiple clock phases.

BACKGROUND OF THE INVENTION

In 2001, the Federal Communications Commission (FCC) designated a large contiguous block of 7 GHz bandwidth for communications in the 57 GHz to 64 GHz spectrum. This frequency band may be used by the spectrum users on an unlicensed basis, that is, the spectrum is accessible to anyone, subject to certain basic, technical restrictions such as maximum transmission power and certain coexistence mechanisms. The communications taking place in this band are often referred to as '60 GHz communications'. With respect to the accessibility of this part of the spectrum, 60 GHz communications is similar to other forms of unlicensed spectrum use, for example Wireless LANs or Bluetooth in the 2.4 GHz ISM bands. However, communications at 60 GHz may be significantly different in aspects other than accessibility. For example, 60 GHz signals may provide markedly different communications channel and propagation characteristics, not least due to the fact that 60 GHz radiation is partly absorbed by oxygen in the air, leading to higher attenuation with distance. On the other hand, since a very large bandwidth of 7 GHz is available, very high data rates may be achieved. Among the applications for 60 GHz communications are wireless personal area networks, wireless high-definition television signal, for example from a set top box to a display, or Point-to-Point links.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for a receiver with undersampling mixing using multiple clock phases, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for a receiver with undersampling mixing using multiple clock phases. Exemplary aspects of the invention may comprise undersampling a received wireless signal utilizing a plurality of undersamplers and clocking each of the plurality of undersamplers with a separate clock signal. Each of the separate clock signals may be at a sampling frequency but with a different phase angle. The difference of the phase angle between each of the separate clock signals may be adjusted and may be determined by a number of the plurality of undersamplers. A gain ratio may be configured for two signals summed to generate each of the separate clock signals for the phase angle adjusting. The two signals may comprise in-phase and quadrature signals. Each of the summed signals may be normalized utilizing limiters. The sampling frequency may be an integer sub-harmonic of the received wireless signal. The plurality of undersamplers may comprise track and hold circuits or sample and hold circuits. The signals generated by each of the plurality of undersamplers may be bandpass filtered.

Figure 1:
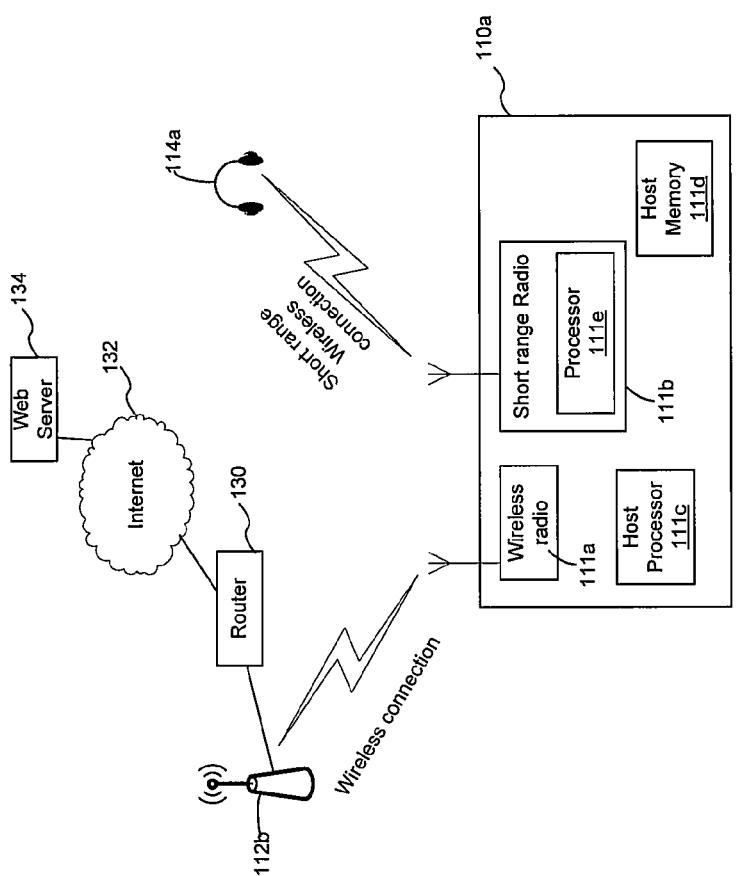
FIG. 1 is a diagram illustrating an exemplary wireless communication system, in accordance with an embodiment of the invention.

FIG. 1 is a diagram illustrating an exemplary wireless communication system, in accordance with an embodiment of the invention. Referring to FIG. 1, there is shown an access point 112*b*, a computer 110*a*, a headset 114*a*, a router 130, the Internet 132 and a web server 134. The computer or host device 110*a* may comprise a wireless radio 111*a*, a short-range radio 111*b*, a host processor 111*c*, and a host memory 111*d*. There is also shown a wireless connection between the wireless radio 11*a* and the access point 112*b*, and a short-range wireless connection between the short-range radio 111*b* and the headset 114*a*.

Frequently, computing and communication devices may comprise hardware and software to communicate using multiple wireless communication standards. The wireless radio 11*a* may be compliant with a mobile communications standard, for example. There may be instances when the wireless radio 111*a* and the short-range radio 111*b* may be active concurrently. For example, it may be desirable for a user of the computer or host device 110*a* to access the Internet 132 in order to consume streaming content from the Web server 134. Accordingly, the user may establish a wireless connection between the computer 110*a* and the access point 112*b*. Once this connection is established, the streaming content from the Web server 134 may be received via the router 130, the access point 112b, and the wireless connection, and consumed by the computer or host device 110a. The processor 111e may control signal processing, clock signals and delays, for example, in the short range radio 111b.

It may be further desirable for the user of the computer 110a to listen to an audio portion of the streaming content on the headset 114a. Accordingly, the user of the computer 110a may establish a short-range wireless connection with the headset 114a. Once the short-range wireless connection is established, and with suitable configurations on the computer enabled, the audio portion of the streaming content may be consumed by the headset 114a. In instances where such advanced communication systems are integrated or located within the host device 110a, the radio frequency (RF) generation may support fast-switching to enable support of multiple communication standards and/or advanced wideband systems like, for example, Ultrawideband (UWB) radio. Other applications of short-range communications may be wireless High-Definition TV (W-HDTV), from a set top box to a video display, for example. W-HDTV may require high data rates that may be achieved with large bandwidth communication technologies, for example UWB and/or 60-GHz communications.

Undersampling may be utilized to down-convert RF signals in 60 GHz wireless systems. In the systems, very high frequency clock signals may be difficult to generate and accurately control in wireless systems such as the short range radio 111b. By utilizing a plurality of undersamplers with phase differentiated clock signals, a lower clock frequency may be utilized. The control of the undersampling process may be enabled by a processor, such as the processor 111e.

Figure 2:
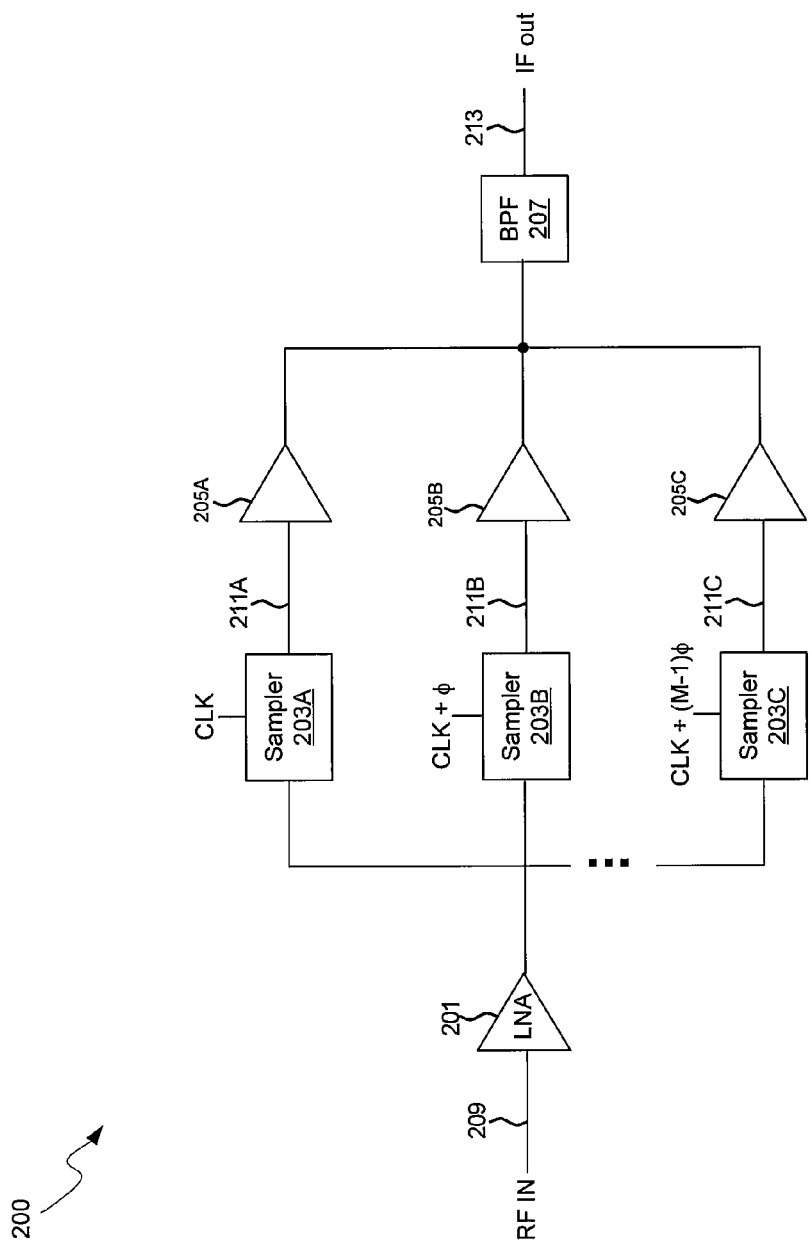
FIG. 2 is a block diagram illustrating an exemplary multiphase undersampling process, in accordance with an embodiment of the invention.

FIG. 2 is a block diagram illustrating an exemplary multi-phase undersampling process, in accordance with an embodiment of the invention. Referring to FIG. 2 there is shown a multi-phase undersampler comprising a low noise amplifier (LNA) 201, undersamplers 203A, 203B and 203C, buffers 205A, 205B and 205C and a bandpass filter (BPF) 207. There is also shown an RF input signal 209, undersampled signals 211A, 211B and 211C, and an IF output signal 213.

The LNA 201 may comprise suitable circuitry, logic and/or code that may enable amplification of an RF signal. In an embodiment of the invention, the gain level of the LNA 201 may be adjustable, depending on the magnitude of the received signal and the desired signal level at the output of the LNA 201. The input of the LNA 201 may be enabled to receive an RF signal at a desired frequency. The output of the LNA 201 may be communicatively coupled to the undersamplers 203A, 203B and 203C.

The undersamplers 203A, 203B and 203C may comprise suitable circuitry, logic and/or code that may enable undersampling of a received RF signal. The undersamplers 203A, 203B and 203C may comprise track and hold circuits comprising one or more CMOS switches and one or more capacitors, for example, and may sample a signal at a frequency determined by input clock signals CLK, CLK+$\phi$, CLK+(M−1)$\phi$. The generation of the clock signals CLK, CLK+$\phi$, CLK+(M−1)$\phi$ is described further with respect to FIG. 3

Each of the clock signals CLK, CLK+$\phi$ and CLK+(M−1)$\phi$ may be at the same frequency, but with a different phase, indicated by $\phi$ and (M−1)$\phi$, where M is an integer defining the number of undersamplers to be utilized. The number of undersamplers is not limited to the number shown in FIG. 2. Accordingly any number of undersamplers may be utilized depending on the frequency of the RF signal and the clock source utilized to generate the CLK signal.

In another embodiment of the invention, the undersamplers 203A, 203B and 203C may comprise sample and hold circuits comprising a plurality of CMOS switches and one or more capacitors, for example.

The buffers 205A, 205B and 205C may comprise suitable circuitry, logic and/or code that may enable buffering different stages of a circuit, such as the undersamplers 203A, 203B and 203C and the BPF 207. The buffers 205A, 205B and 205C may receive input signal from the undersamplers 203A, 203B and 203C, respectively, and may generate output signals that may be communicated to the BPF 207.

The BPF 207 may comprise suitable circuitry, logic and/or code that may enable filtering of signals at a frequency outside a desired range. The BPF 207 may comprise an LC circuit, for example, and may be programmable with respect to the allowed frequency and bandwidth. In another embodiment of the invention, the BPF 207 may comprise a coplanar waveguide or microstrip bandpass filter.

In operation, an RF input signal 209 may be communicated to the LNA 201 and may be amplified at a desired gain level before being communicated to the undersamplers 203A, 203B and 203C. Each undersampler 203A, 203B and 203C may sample the received signal at the same frequency, but with different phases, as indicated by the clock signals CLK, CLK+$\phi$, CLK+(M−1)$\phi$, where M indicates the number of undersamplers and may determine the phase difference between the clock signals. For example, in instances where M may be equal to four, the phase difference, $\phi$, between each clock signal may be equal to 90 degrees. By undersampling a received RF signal with a plurality of undersamplers with an appropriate clock signal phase difference, the harmonics of the RF signal located at integer harmonics of the clock frequency may be cancelled.

In addition, utilizing a plurality of undersamplers may enable the utilization of a lower frequency clock frequency, CLK. In this manner, very high frequency signals, 60 GHz, for example, may be sampled without requiring very high frequency clocks. The sampling frequency may be determined utilizing the following relationship:

$$CLK = 1/N(f_{RF} - IF)$$

where N is an integer and IF is the frequency of the desired IF signal.

The undersampler output signals 211A, 211B and 211C may be communicated to the inputs of the buffers 205A, 205B and 205C. The buffered signals may then be filtered by the BPF 207, generating the IF output signal 213. By tuning the BPF 207 to a desired sampling frequency harmonic, the IF output signal 213 may comprise the desired down-converted signal extracted from the RF input signal 209, and may comprise a baseband signal.

Figure 3:
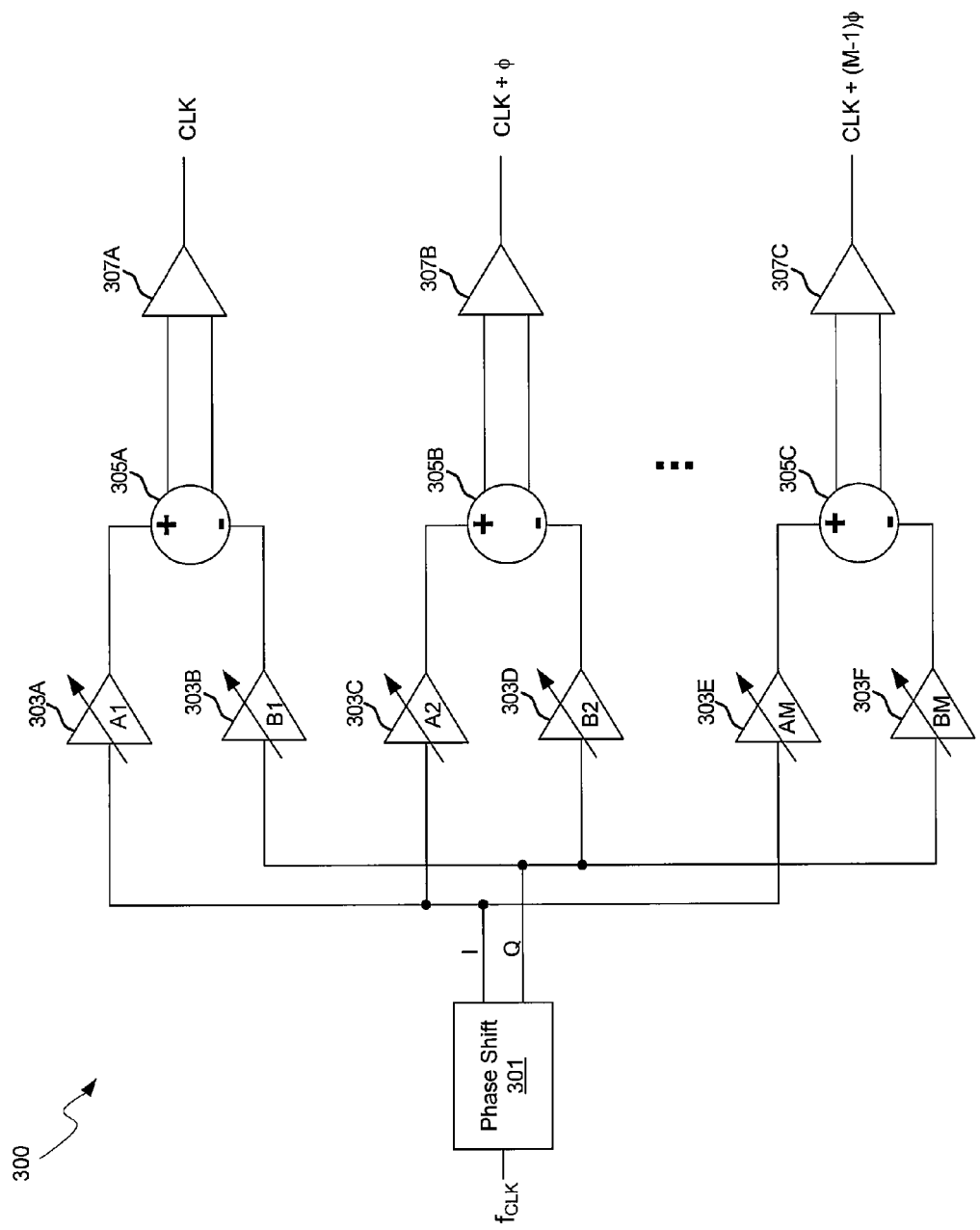
FIG. 3 is a block diagram illustrating an exemplary multiphase clock signal generator circuit, in accordance with an embodiment of the invention.

FIG. 3 is a block diagram illustrating an exemplary multi-phase clock signal generator circuit, in accordance with an embodiment of the invention. Referring to FIG. 3, there is shown a clock generator circuit 300 comprising a phase shifter 301, programmable gain amplifiers (PGAs) 303A-303F, adders 305A, 305B and 305C and limiters 307A, 307B and 307C. There is also shown an input signal $f_{CLK}$, in-phase and quadrature signals, I and Q, and output clock signals CLK, CLK+$\phi$, CLK+(M−1)$\phi$, where M may equal the number of clock signals being generated. For example, in instances where there may be four undersamplers, M=4, the phase angle $\phi$ may be 360 degrees/4=90, and the CLK signals may be at 0, 90, 180 and 270 degrees.

The phase shifter 301 may comprise suitable circuitry, logic and/or code that may enable the generation of I and Q signals by receiving an input clock signal, phase shifting the signal by 90 degrees, and generating two outputs comprising the original signal and the 90 degree phase shifted signal. The outputs of the phase shifter 301 may be communicatively coupled to the inputs of the PGAs 303A-303F.

The PGAs 303A-303F may comprise suitable circuitry, logic and/or code that may be enable receiving a signal and generating an amplified output signal. Each PGA may be individually programmable to a different gain level, indicated by A1, B1, A2, B2, AM and BM, where M indicates the number of clock signals being generated. The PGAs 303A-303F may be controlled by a processor, such as the processor 111e, described with respect to FIG. 1.

The adders 305A, 305B and 305C may comprise suitable circuitry, logic and/or code that may enable receiving one or more input signals and generating an output signal proportional to the sum of the input signals.

The limiters 307A, 307B and 307C may comprise suitable circuitry, logic and/or code that may enable receiving an input signal and generating an output signal with the same phase and frequency but with a magnitude equal to +/−V, where V is a predefined voltage. The limiters 307A, 307B and 307C may act as a comparator with a zero volt reference, in that the output may be either +V or −V depending on whether the input signal may be positive or negative. Thus, even in instances where the input signal may have a varying magnitude, the output of the limiters may be normalized to comprise identical signals in magnitude and frequency, but with different phase. The outputs of the limiters 307A, 307B and 307C may comprise the clock signals, CLK, CLK+φ, CLK+(M−1)φ, described with respect to FIG. 2.

In operation, a reference clock signal, $f_{CLK}$, may be communicatively coupled to the phase shifter 301, which may generate I and Q signals. The I and Q signals may be communicatively coupled to the PGAs 303A-303F. The phase for each output clock signal may be controlled by individually adjusting the gain of each PGA. For example, the output clock signal CLK+φ may be determined by the ratio of A2 and B2. The phase may be calculated using the following relationship defining the output signal of the adder 305B:

$$A2^* \sin(2\pi f_{CLK}t) - B2^* \cos(2\pi f_{CLK}t)$$

The phase angle difference, φ, between the clock signals CLK and CLK+φ may be calculated from the following equation:

$$\tan(\phi) = A2/B2$$

In this manner, the phase angle between the clock signals may be configured by adjusting the gain ratios A1/B1, A2/B2 and AM/BM in the PGAs 303A-303F. For example, in instances where A2 may be equal to B2, the phase angle φ may be equal to 45 degrees.

Figure 4:
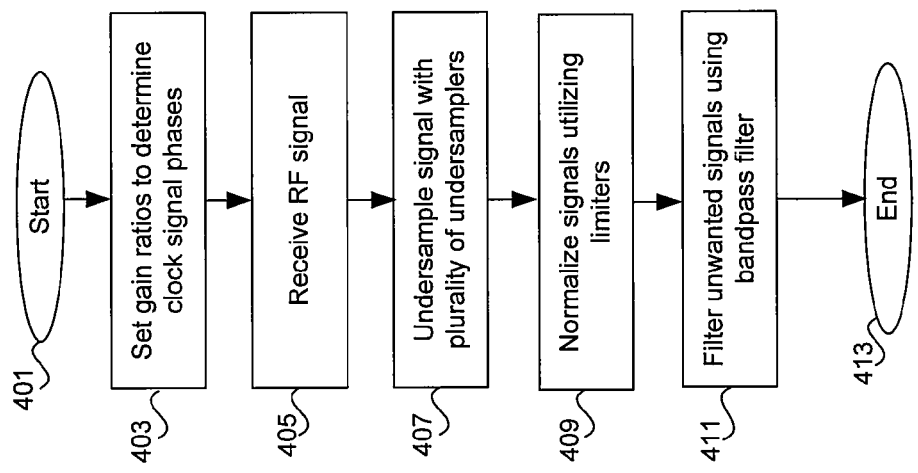
FIG. 4 is a flow diagram illustrating an exemplary multiphase undersampling process, in accordance with an embodiment of the invention.

FIG. 4 is a flow diagram illustrating an exemplary multiphase undersampling process, in accordance with an embodiment of the invention. referring to FIG. 4, in step 403, after start step 401, the gain ratios of the PGAs 303A-303F may be set to configure the clock signal phases. In step 405, an RF signal may be received, followed by step 407 where the received signal may be undersampled by the plurality of undersamplers. In step 409, the undersampled signals may be normalized by limiters, followed by step 411 where unwanted signals may be filtered utilizing a bandpass filter, and finally end step 413.

In an embodiment of the invention, a method and system are disclosed for undersampling a received wireless signal 209 utilizing a plurality of undersamplers 203A, 203B and 203C and clocking each of the plurality of undersamplers with a separate clock signal CLK, CLK+φ, CLK+(M−1)φ. Each of the separate clock signals CLK, CLK+φ, CLK+(M−1)φ may be at a sampling frequency but with a different phase angle. The difference, φ, of the phase angle between each of the separate clock signals may be adjusted and may be determined by a number, M, of the plurality of undersamplers. A gain ratio A1/B1, A2/B2, AM/BM may be configured for two signals, I and Q, summed to generate each of the separate clock signals CLK, CLK+φ, CLK+(M−1)φ for the phase angle adjusting. The two signals may comprise in-phase and quadrature signals. Each of the summed signals may be normalized utilizing limiters 307A, 307B and 307C. The sampling frequency, $F_{CLK}$, may be an integer sub-harmonic of the received wireless signal 209. The plurality of undersamplers 203A, 203B and 203C may comprise track and hold circuits or sample and hold circuits. The signals generated 211A, 211B and 211C by each of the plurality of undersamplers 203A, 203B and 203C may be bandpass filtered.

Certain embodiments of the invention may comprise a machine-readable storage having stored thereon, a computer program having at least one code section for a receiver with undersampling mixing using multiple clock phases, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for wireless communication, the method comprising:
   in a wireless receiver,
   undersampling a received wireless signal utilizing three or more undersamplers;
   clocking each of said three or more undersamplers with a separate clock signal, wherein each of said separate clock signals is at a sampling frequency but has equally spaced phase angles that are independent of the phase of the received wireless signal;
   adjusting said equally spaced phase angles between each of said separate clock signals by configuring a gain ratio for two signals summed to generate each of said separate clock signals;
   summing an output of each of said three or more undersamplers to produce a single signal having a frequency downconverted from a frequency of said received wireless signal.

2. A method, the method comprising:
   in a wireless receiver,
   undersampling a received wireless signal utilizing a plurality of undersamplers;
   clocking each of said plurality of undersamplers with a separate clock signal, wherein each of said separate clock signals is at a sampling frequency but has equally spaced phase angles that are independent of the phase of the received wireless signal;
   adjusting said equally spaced phase angles between each of said separate clock signals by configuring a gain ratio for two signals summed to generate each of said separate clock signals;
   summing an output of each of said undersamplers to produce a single signal having a frequency downconverted from a frequency of said received wireless signal.

3. The method according to claim 2, wherein said equally spaced phase angles between each of said separate clock signals is determined by a number of said plurality of undersamplers.

4. The method according to claim 1, comprising normalizing each of said summed signals utilizing limiters.

5. The method according to claim 1, wherein said sampling frequency is an integer sub-harmonic of said received wireless signal.

6. The method according to claim 1, wherein said three or more undersamplers comprise track and hold circuits.

7. The method according to claim 1, wherein said three or more undersamplers comprise sample and hold circuits.

8. The method according to claim 1, comprising bandpass filtering signals generated by each of said three or more undersamplers.

9. A system for wireless communication, the system comprising:
   one or more circuits in a wireless receiver that are configured to:
   undersample a received wireless signal utilizing three or more undersamplers;
   clock each of said three or more undersamplers with a separate clock signal, wherein each of said separate clock signals is at a sampling frequency but has equally spaced phase angles that are independent of the phase of the received wireless signal;
   adjust said equally spaced phase angles between each of said separate clock signals by configuring a gain ratio for two signals summed to generate each of said separate clock signals;
   sum an output of each of said three or more undersamplers to produce a single signal having a frequency downconverted from a frequency of said received wireless signal.

10. A system, the system comprising:
    one or more circuits in a wireless receiver that are configured to:
    undersample a received wireless signal utilizing a plurality of undersamplers;
    clock each of said plurality of undersamplers with a separate clock signal, wherein each of said separate clock signals is at a sampling frequency but has equally spaced phase angles that are independent of the phase of the received wireless signal;
    adjust said equally spaced phase angles between each of said separate clock signals by configuring a gain ratio for two signals summed to generate each of said separate clock signals;
    sum an output of each of said plurality of undersamplers to produce a single signal having a frequency downconverted from a frequency of said received wireless signal.

11. The system according to claim 10, wherein said equally spaced phase angles between each of said separate clock signals is determined by a number of said plurality of undersamplers.

12. The system according to claim 9, wherein said sampling frequency is an integer sub-harmonic of said received wireless signal.

13. The system according to claim 9, wherein said three or more undersamplers comprise track and hold circuits.

14. The system according to claim 9, wherein said three or more undersamplers comprise sample and hold circuits.

15. The system according to claim 9, wherein said one or more circuits are operable to bandpass filter signals generated by each of said three or more undersamplers.

* * * * *